(12) United States Patent
Pressacco et al.

(10) Patent No.: US 10,488,852 B2
(45) Date of Patent: Nov. 26, 2019

(54) QUALITY CONTROL METHOD FOR REGULATING THE OPERATION OF AN ELECTROMECHANICAL APPARATUS, FOR EXAMPLE AN EBM APPARATUS, IN ORDER TO OBTAIN CERTIFIED PROCESSED PRODUCTS

(71) Applicant: LIMACORPORATE S.P.A., Udine (IT)

(72) Inventors: Michele Pressacco, Udine (IT); Marco Regis, Udine (IT)

(73) Assignee: LIMACORPORATE S.P.A., San Daniele Del Friuli (UD) (IT)

( * ) Notice: Subject to any disclaimer, the term of this patent is extended or adjusted under 35 U.S.C. 154(b) by 95 days.

(21) Appl. No.: 15/557,415

(22) PCT Filed: Mar. 14, 2016

(86) PCT No.: PCT/EP2016/055456
§ 371 (c)(1),
(2) Date: Sep. 11, 2017

(87) PCT Pub. No.: WO2016/142552
PCT Pub. Date: Sep. 15, 2016

(65) Prior Publication Data
US 2018/0113445 A1 Apr. 26, 2018

(30) Foreign Application Priority Data
Mar. 12, 2015 (IT) .............................. MI2015A0378

(51) Int. Cl.
*G05B 19/418* (2006.01)
*B33Y 50/02* (2015.01)
(Continued)

(52) U.S. Cl.
CPC ...... *G05B 19/41875* (2013.01); *B23K 15/002* (2013.01); *B23K 15/0013* (2013.01);
(Continued)

(58) Field of Classification Search
CPC .... G05B 19/41875; G05B 2219/32368; G05B 2219/49018; B23K 15/02; B23K 15/0013;
(Continued)

(56) References Cited

U.S. PATENT DOCUMENTS 5,587,664 A * 12/1996 Banitt .................. G01R 31/308
324/750.14
5,680,056 A * 10/1997 Ito ........................ G01R 31/309
324/501
(Continued)

FOREIGN PATENT DOCUMENTS

EP       2 620 240 A1    1/2013

OTHER PUBLICATIONS

Stwora et al., "Influence of Selected Parameters of Selective Laser Sintering Process on Properties of Sintered Materials", Journal of Achievements in Materials, Manufacturing Engineering Dec. 2013,6 pgs.
(Continued)

*Primary Examiner* — Brian W Wathen
*Assistant Examiner* — Mohammed Shafayet
(74) *Attorney, Agent, or Firm* — Hickman Palermo Becker Bingham LLP; Malgorzata A. Kulczycka (57) ABSTRACT

The invention relates to a method for regulating the operation of an electromechanical apparatus (1), for example an EBM apparatus, in order to obtain certified processed products, wherein it is provided an initial calibration step that is intended to check the proper functioning of all the component parts of the apparatus (1) structured to ensure the
(Continued)

complete functionality and a subsequent quality control step carried out on the obtained products by the carried out working process. The method entails the following steps:

- defining a plurality of measurement parameters relating to the component parts of the apparatus;
- measuring at least some of said parameters by means of sensors and/or measurement indicators related to said parameters during at least one processing phase performed by the apparatus;
- performing a quality control step on the obtained products after the working process obtaining data on any deviation from the expected quality;
- comparing the detected measurements of said parameters and data on any deviation from the expected quality with corresponding values of reference parameters available for that specific apparatus and for those products;
- detecting any deviations in one or more of said parameters or said data with respect to the values of the reference parameters;
- computing, on the basis of such differences, a total correction and regulation value;
- applying said total correction and regulation value preferably to only one of said parameters prior to the subsequent process, for example to the generation energy of the electrons beam (3). Basically, the method of the present invention allows obtaining semi-finished products free from structural defects by means of a primary check of the correct functioning of the various component parts of the apparatus (calibration procedure), a secondary check of the operational effectiveness of the process itself (operational qualification procedure) and a further final check of the process stability and repeatability within a process window (performance qualification).

15 Claims, 4 Drawing Sheets (51) Int. Cl.
*B23K 15/00* (2006.01)
*B23K 15/02* (2006.01)

(52) U.S. Cl.
CPC ...... *B23K 15/0033* (2013.01); *B23K 15/0086* (2013.01); *B23K 15/02* (2013.01); *B33Y 50/02* (2014.12); *G05B 2219/32368* (2013.01); *G05B 2219/49018* (2013.01)

(58) Field of Classification Search
CPC .............. B23K 15/0033; B23K 15/002; B23K 15/0086; B33Y 50/02; H01J 37/305; H01J 37/304; H01J 2237/30433; H01J 2237/3128; Y02P 10/295; B22F 2003/1057; B22F 3/1055
USPC ........................................................ 700/110
See application file for complete search history.

(56) References Cited

U.S. PATENT DOCUMENTS

| | | | |
|---|---|---|---|
| 5,973,323 A * | 10/1999 | Adler | H01J 37/285 250/307 |
| 6,580,959 B1 | 6/2003 | Mazumder | |
| 6,809,534 B2 * | 10/2004 | Yamada | G01R 31/307 324/754.22 |
| 9,468,973 B2 * | 10/2016 | Ljungblad | B22F 3/1035 |
| 9,789,563 B2 * | 10/2017 | Elfstroem | B23K 15/0086 |
| 10,137,500 B2 * | 11/2018 | Blackmore | B22F 3/1055 |
| 2002/0145396 A1 * | 10/2002 | Gordon | B82Y 10/00 315/368.16 |
| 2002/0181655 A1 * | 12/2002 | Schoen | G21B 1/15 378/119 |
| 2003/0161440 A1 * | 8/2003 | Boyd | A61B 6/032 378/98.12 |
| 2005/0285541 A1 * | 12/2005 | LeChevalier | H01J 3/36 315/169.3 |
| 2007/0194232 A1 * | 8/2007 | Nagahama | H01J 37/026 250/310 |
| 2008/0203923 A1 * | 8/2008 | Larson | H05H 15/00 315/5.15 |
| 2008/0302964 A1 * | 12/2008 | Shinada | G01R 31/305 250/310 |
| 2009/0045340 A1 * | 2/2009 | Terada | H01J 37/05 250/311 |
| 2010/0068408 A1 * | 3/2010 | Zaykova-Feldman | C23C 16/0227 427/532 |
| 2013/0055568 A1 * | 3/2013 | Dusel | B22F 3/1055 29/888.02 |
| 2014/0061167 A1 * | 3/2014 | Stecker | B22F 3/1055 219/76.1 |
| 2014/0124483 A1 * | 5/2014 | Henn | B23K 15/0086 219/76.1 |
| 2014/0132299 A1 * | 5/2014 | Kadyshevitch | G01R 31/305 324/754.24 |
| 2014/0158667 A1 * | 6/2014 | Stecker | B23K 15/0086 219/76.12 |
| 2015/0017054 A1 * | 1/2015 | Jakimov | B23K 26/08 419/53 |
| 2015/0174822 A1 * | 6/2015 | Huang | B22F 3/1055 264/497 |
| 2016/0001509 A1 * | 1/2016 | Long | B23K 15/0086 700/98 |

OTHER PUBLICATIONS

Monzon et al., "Standardization in Additive Manufacturing: Activities Carried out by International Organizations and Projects", Int J Adv Manuf Technol dated 2015, 11 pages.
Kleszczynski et al., "Mechanical Properties of Laser Beam Melting Components Depending on Various Process Errors". IFIP, dated 2013, 14 pages.
European Patent Office, "Search Report" in application No. PCT/EP2016/055456, dated Mar. 12, 2015, 6 pages.
ASTM International, Standard Specification for Additive Manufacturing Nickel Alloy (UNS N07718) with Powder Bed Fusion, dated Mar. 2014, 8 pages.
Alphons Anandaraj Antonysamy, Microstructure, Texture and Mechanical Property Evolution during Additive Manufacturing of Ti6Al4V Alloy for Aerospace Applications, dated 2012, 157 pages, 2 parts.

* cited by examiner

QUALITY CONTROL METHOD FOR REGULATING THE OPERATION OF AN ELECTROMECHANICAL APPARATUS, FOR EXAMPLE AN EBM APPARATUS, IN ORDER TO OBTAIN CERTIFIED PROCESSED PRODUCTS

This application is a US national stage application filed under 35 U.S.C. § 371 based upon International Patent Application PCT/EP2016/055456, filed 14 Mar. 2016, which claims the benefit of Italian application 102015902337664, filed 12 Mar. 2015, the entire contents of which are hereby incorporated by reference as if fully set forth herein for all purposes.

FIELD OF APPLICATION

The present invention relates to a method for regulating the operation of an electromechanical apparatus, for example an EBM apparatus, in order to obtain certified processed products.

More particularly, the invention relates to the field of additive manufacturing techniques and technologies. More specifically, the present invention falls within the scope of the manufacture of three-dimensional objects starting from computerized 3D models, especially but not exclusively in the field of additive manufacturing using the Electron Beam Melting (EBM) technology and the following description is given with this specific field of application only to simplify its exposure.

Even more particularly, the invention relates to a method of validation of the EBM process to allow qualifying and certifying the proper functionality of an EBM apparatus or system and of the related products obtained therewith.

PRIOR ART

The EBM (Electron Beam Melting) technology allows creating semi-finished objects or components starting directly from metal powders by using a focused electrons beam according to the principles of additive manufacturing technologies (also called "additive manufacturing"). This technology is described for example in PCT patent application No. WO2011/008143 of the Swedish Arcam.

EBM apparatuses generally have a high voltage unit which powers an electron gun adapted to generate an electrons beam which is conveyed inside a working chamber. The whole set is controlled by suitable programmable means.

The EBM technology uses this electrons beam for sintering a predetermined amount of powder that is drawn from dedicated tanks and distributed on a working area of the EBM apparatus.

Inside the working chamber, the production process involves placing the powder layers of material to be molten under vacuum. Working under vacuum also allows working on materials which would otherwise react immediately with the oxygen in the air, thus producing undesirable compounds.

The process that is implemented within an EBM apparatus includes three steps, which may be schematized as follows:

1. First input step comprising:
   Entering or uploading files about the components to be made to drive the programmable means dedicated to manufacturing the products;
   Inserting the metal powders inside the working chamber.

2. Second fusion step, which entails:
   Adjusting the settings and control parameters of software and hardware components of the EBM apparatus;
   Forming the vacuum in the fusion chamber;
   Actual EBM fusion;

3. Third final output step, obtaining the finished product.

The machine settings are of paramount importance, both in terms of hardware components and in terms of software applications that regulate the execution of the process.

To better understand the aspects of the present invention, it is important to keep in mind that the electrons of the electron gun are produced by feeding a tungsten filament with a high potential, generated by a high voltage unit (HV unit). Moreover, in order to be effective, it is necessary that the electrons beam is generated in conditions of absolute vacuum, in order to avoid phenomena of interaction of the electrons with molecules of the atmosphere.

It is also essential that these conditions can be maintained with stability in order to allow the correct execution of the fusion process and to repeat subsequent fusion processes with guarantee of quality and stability in production.

More specifically, the process stability is guaranteed by certain fundamental parameters:

a) the current of the filament, which quantifies the kinetic energy of the emitted electrons and the consequent power/speed of the electrons beam;

b) the vacuum degree of the electrons beam generation environment, both in the electron gun and in the fusion chamber;

c) the movement of the picker/distributor, i.e. the device intended to pick up and distribute the correct amount of powder, so as to obtain a uniform layer for the fusion step;

d) the composition or the theme, that is to say, the set of information which contains the settings and the management parameters of the electrons beam which regulate the energy of the electrons beam according to the operations to be performed using the electrons beam; these operations include, for each fusion process of the powder layers, the following steps:
   powder heating,
   contour fusion,
   solid parts,
   net structures.

e) movement of the shifter tray, which by lowering ensures the development and the realization of the sintered products;

f) temperature of the platform or working plate (called start plate), measured constantly to check that the fusion temperature of the powders is constant and leads to the generation of a uniform fusion from the microstructural point of view. In fact, the proper operation of the electrons beam is controlled and regulated by reading the temperature of the start plate.

The EBM process is completed by using some auxiliary units necessary for the recirculation and reuse of the raw material (i.e. powders), and for the post-process treatment of the sintered products and components (for example, the cleaning thereof from non-aggregated powders).

The EBM apparatus is provided with some important ancillary components, such as an apparatus called Controlled Vacuum (CV) which regulates the vacuum level by the controlled introduction of small amounts of inert gas within the chamber, and an interface application software which ensures the integration and the functioning of all the machine parts.

It is apparent that an EBM apparatus is a complex electromechanical system in which there are auxiliary units necessary for moving the system components and the raw material (powders), as well as for post-processing the products made and for the maintenance of the entire apparatus.

For example, the measurement of the amount of powder distributed in step (c) is controlled by reading two sensors placed at the sides of the start plate.

Instead, as part of step (d), the parameters of the composition or theme are responsible for setting the energy that the electrons beam must have in order to optimize the fusion process, for example in terms of speed of the electrons beam or current passage to be delivered to the filament. In fact, for the fusion process to be optimal and allow the maximum flexibility in terms of geometries that can be made, the passage of the electrons beam must be finely modulatable only within predetermined areas for the realization of particular fusion lines.

The movement and modulation operations of the electrons beam are carried out through the use of magnetic coils placed at the sides of the column which convey the electrons in the EBM chamber.

Also as regards steps (e) and (f), in order to achieve the desired geometries of the products to be sintered, in addition to suitably moving the electrons beam and modulating its energy to allow proper transfer of energy to the powder, the temperature of the molten layer should be kept constant so as to achieve uniform products from the point of view of their structural density and their physical-chemical-mechanical properties.

Furthermore, also the volume of the material to be melted affects the density and the characteristics of the obtained products, and different volumes to be melted require different energies. That is why also the correct amount of powder distributed on the start plate must be controlled and constant.

Obviously, the manufacturer of the EBM apparatus provides the basic reference specifications illustrating the execution mode of the operations since the start of the process to continue with the post-processing and the system maintenance; all in a dedicated manual and with training courses.

Currently, the EBM systems have the EC mark required, like any other product, for their introduction within the European market. This EC certification process involves an installation procedure and a machinery qualification.

However, while the system functionality is initially guaranteed by the manufacturer and verified upon the first installation, a qualification and certification of the EBM process functionality during the operations, namely during many processing steps that are carried out each time, is completely missing.

The impact of a malfunctioning of one or more parts of the system cannot be currently ascertained, not even a posteriori by third parties; moreover, some control procedures of the system parts are sometimes missing in the documentation provided by the manufacturer and the consequences of a wrong system calibration or setup in terms of acceptability of the material produced, i.e. absence of defects and/or the correct manufacture of the designed product, are also unknown.

The above deficiencies can lead to some process deviations during the actual fusion step which, if not properly calibrated using costly and repeated verification tests and adjustments of the machine, can result in the creation of non-compliant products.

The deficiencies in the process functionality control can lead to the following effects:
high percentage of waste in production;
increased costs and manufacturing times;
need for frequent and constant control of all the sintered products; this control is also often difficult and laborious due to the extreme constructive freedom that EBM systems allow;
need to adopt the EBM post-fusion recovery treatments able to mitigate some manufacturing defects, such as HIP (Hot Isostatic Pressing).

All of this represents a major drawback in terms of productivity obtainable with this manufacturing technology, but also for its applicability in areas in which respecting the quality of production is of fundamental importance (for example in the medical field, in aerospace, etc.).

In order to limit the consequences of these drawbacks, the manufacturer of EBM system has only provided an initial apparatus validation protocol, linking them to a specific set of machine settings.

Although in many ways advantageous and susceptible to improve the quality of the process in terms of good quality of the products made, these expedients suggested by the manufacturer do not allow remedying the deviations of the EBM systems.

Paradoxically, the verifications of proper calibration and setup of the apparatus parameters and its component parts are also subject to deviations to the point that these deviations affect the quality of the products obtained, especially in the medical field.

Therefore, at present, these aspects remain undefined, and the know-how at the basis of some operating steps of the apparatus is unknown, for example: the connection between the change of the parameters and the technical effect on the machine and on the material produced remains still not formalized for the user of the apparatus.

The prior art proposes a solution, described in U.S. patent application no. US 2015/017054, to try to improve the quality of the production obtainable by means of an EMB apparatus over time. However, this solution is limited to measuring eddy currents in the product under development as the only quality control parameter, but does not check the operating parameters of the apparatus itself.

The technical problem to be solved is that of devising a method for regulating the operation of an electromechanical apparatus, of which all the individual structural and functional aspects of calibration are not known in detail, for example an EBM apparatus, in order to obtain certified processed products.

The method in question should have such functional characteristics as to allow validating the EBM fusion process in order to qualify and certify the functionality of the same in a simple, effective, efficient, and reliable manner with a high degree of safety.

Another object of the invention should be that of covering any knowledge deficiencies about the effects of calibration and of the process parameters of the apparatus that allows manufacturing the three-dimensional products through the EBM technology.

The known art proposes a solution to improve in time the quality of the production obtainable by a EBM apparatus. Such a solution is disclosed in the US patent application No. US 2015/017054. However, that solution is limited to detect eddy currents inside the product under construction as a single parameter for detecting the final quality and does not care to check other functioning parameters of the apparatus itself.

In brief, the problem underlying the invention is that of devising a method of the above type and adapted to enable a validation of the EBM process by providing control procedures of all the component parts of the apparatus, defining a correct calibration and setting of the apparatus itself and assessing the impact of a possible malfunction of one or more parts, taking corrective actions and thus avoiding the deviation of the EBM process.

SUMMARY OF THE INVENTION

The solution idea underlying the present invention is to find a method for regulating the operation of an electromechanical apparatus, such as an EBM apparatus, in order to obtain certified processed products, of the type in which an initial calibration step is provided, intended to check the proper functioning of all the component parts of the apparatus adapted to ensure the full functionality thereof, and a subsequent quality control step carried out on the obtained products by the carried out working process; the results of the quality control of the products obtained provide information about possible deviations of predefined process parameters and actions are operationally taken by changing preferably a single related parameter that allows restoring the quality of the production to the desired and expected specifications.

Based on the above solution idea, the technical problem is solved by a method of the type indicated above and characterized by:

defining a plurality of measurement parameters relating to said component parts of the apparatus;
measuring at least some of said parameters by means of sensors and/or measurement indicators coupled to an apparatus control unit and related to said parameters during at least one processing phase performed by said apparatus;
performing a quality control step on the obtained products after the working process obtaining data on any deviation from the expected quality;
comparing the detected measurements of said parameters and data on any deviation from the expected quality with corresponding values of reference parameters available for that specific apparatus and for those products;
detecting any deviations in one or more of said parameters or said data with respect to reference values;
computing, on the basis of such differences, a total correction and regulation value;
applying said total correction and regulation value to the generation energy of an electrons beam of said EBM apparatus or to other system parts.

More in particular, the generation energy of the electrons beam is obtained from formulas for correlating the parameters associated with the component parts of the apparatus, such as:

$$T \propto \frac{E}{A}$$
$$E \propto t \cdot I \cdot V$$

where:
T is the temperature of the molten layer;
E is the energy applied to the electrons beam;
A is the fusion area;
t is the time of the fusion;
I is the current of the correlation filament of the electron beam; and
V the potential across the filament.

Moreover, the apparatus control unit is able to compute on the basis of said formulas, and by means of an automated procedure, the type of energy to apply to the electrons beam to realize processed products corresponding to a predetermined quality level.

The regulation of the electrons beam generation energy is carried out by regulating the current applied to the filament of an electronic generation gun of the electrons beam.

Basically, the method of the present invention allows obtaining semi-finished products free from structural defects by means of a primary check of the correct functioning of the various component parts of the apparatus (calibration procedure), a secondary check of the operational effectiveness of the process itself (operational qualification procedure) based on a specific quality control of the products obtained. A further final check of the process stability and repeatability within a process window is provided (performance qualification).

Any corrections or corrective compensations of process drifts are preferably carried out by changing a single related parameter that, in this case, is represented by the application energy of the electrons beam of the EBM apparatus.

If the results of the checks indicate that only a specific parameter has a drift, for example a parameter related to a structural and mechanical part of the apparatus, it is possible to intervene only on that structural part with a direct recalibration.

In this way, the productivity of the EBM system is significantly improved in terms of reduction of non-compliances due to incorrect settings and/or calibrations of the system, with consequent lowering of the production costs, a process window is defined within which the fundamental characteristics of the material manufactured are respected and unchanged and the process and the production of components using this technology is made certifiable according to the current regulations, for example in the field of quality in the medical field.

The invention comprises the following additional and optional features, taken individually or in combination, if necessary.

For example, the step of defining the plurality of measurement parameters relating to component parts of the apparatus can be modified with the progress of the useful life of the apparatus and also after the application of said total correction and regulation value.

Moreover, the step of measuring said parameters provides a quality control of the products obtained by means of said at least one processing carried out.

Such a quality control includes at least the following tests on product specimens obtained from the processing:
Test about the dimensional correspondence L;
Tensile tests in the z direction;
Tensile tests in the directions x and y;
Complete chemical analysis;
Porosity, discontinuities or micrograph evaluation;
Visual, adhesive and compression analysis of the structural network.

It should also be noted that the measuring phase of at least some of the parameters is performed by means of sensors and/or measurement indicators mounted on the same apparatus.

Moreover, the comparison of measurements taken from said parameters with corresponding values of reference parameters are performed automatically by an application residing in the command and control unit of said apparatus.

The measurements of said parameters and the values of the reference parameters are stored in a memory portion associated to the command and control unit of the apparatus.

Further features and advantages of the EBM process validation method according to the present invention will become apparent from the following description, given only by way of example with reference to the accompanying drawings.

DETAILED DESCRIPTION

While a particular embodiment of the present invention represented in the relevant figures is described hereinafter, it should be noted that the invention is not limited to that particular embodiment; on the contrary, it clarifies several aspects of the present invention while the object and scope of the same are defined by the protection scope of the appended claims.

Before proceeding with the detailed description of the method according to the invention, it is necessary to understand the structure and operation of the electromechanical apparatus on which the method is implemented. In particular, an apparatus operating according to the EBM technology and intended for manufacturing three-dimensional products from metal powders and using a focused electrons beam according to the principles of additive manufacturing technologies is described hereinafter by way of example.

Figure 1:
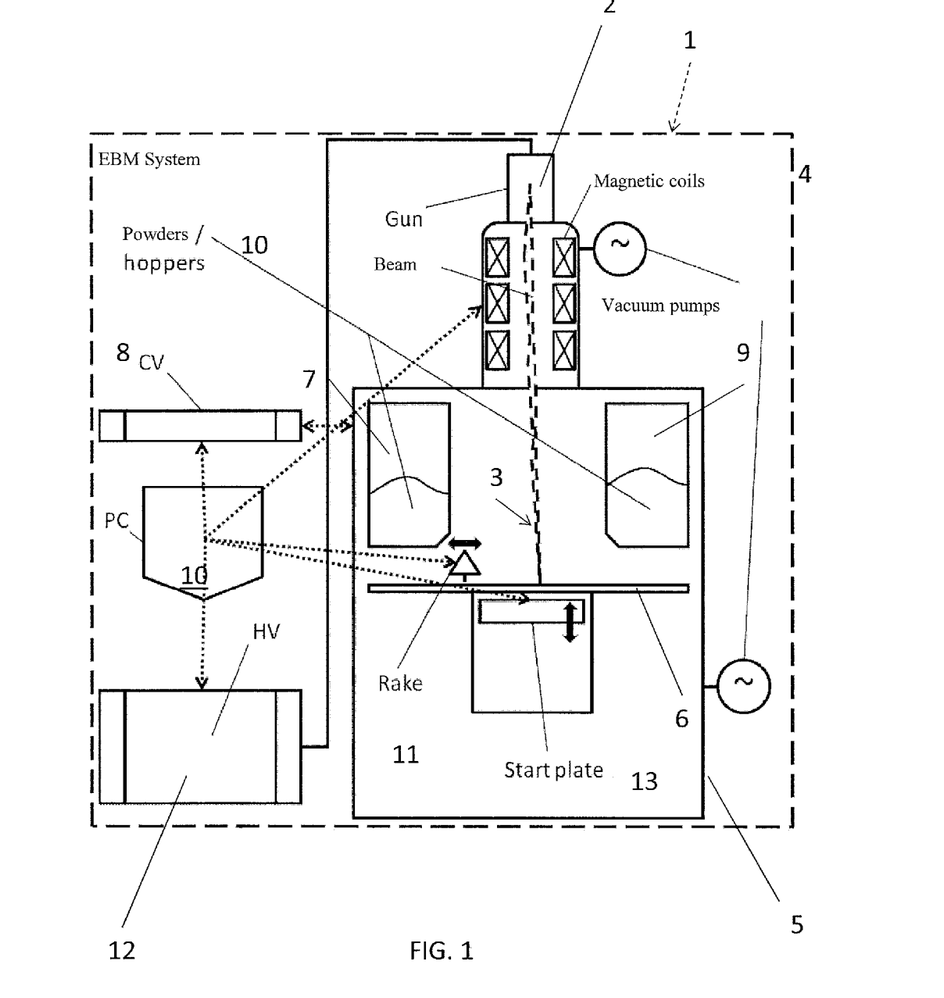
FIG. 1 shows a schematic block view of an electromechanical apparatus, such as an EBM apparatus.

With particular reference to FIG. 1, reference numeral 1 globally and schematically illustrates the structure of an EBM apparatus for the production of three-dimensional objects starting from computerized 3D models. In the specific case, it is an additive manufacturing system using the Electron Beam Melting (EBM) technology.

Apparatus 1 particularly, but not exclusively, treats metal powders such as titanium powders or alloys thereof, such as Ti6Al4V.

It should be noted that the metal material of the powder does not in any way represent a limitation of the rights of the Applicant, as well as of the application scope (biomedical, aerospace, etc.) of the objects obtained by the EBM process.

The EBM apparatus 1 comprises a programmable electronic unit 100 for the command and control of the operational steps of the production process. The electronic unit 100 is conventionally provided with user interfaces such as a keyboard and a display, not shown in the drawings as they are conventional ones.

Unit 100 is also provided with a data processing board provided with an electronic controller in bidirectional communication with a memory bank which may be on board of the board itself or otherwise associated with the command and control unit 100 or in communication therewith.

Control buttons are also provided for the direct regulation of some functions of apparatus 1, such as the start up or reset step, or for forcing predetermined operational regulation steps of the production cycle.

High voltage means HV 12 are connected to the electronic unit 100 for the generation of emission pulses of an electrons beam, schematized in the figures with reference numeral 3.

The electrons beam 3 is generated within an electron gun 2 which, similar to a cathode ray tube, receives incoming high voltage pulses of the generation means 12 and produces the electrons beam 3 directed towards a working plane 6.

More specifically, the electrons beam 3 is emitted by an electron generation system incorporating a crystal element or an incandescent tungsten filament (not shown in the figure). In any case, this system is powered by a high electric potential or by a current that activates the generation means 12. A nozzle (not shown in the figure) placed underneath the crystal element shapes the beam and directs it towards the working plane 6.

Within the electron gun 2 there are some electromagnetic coils 4 which are in turn connected to the electronic unit 100 which commands and controls the energization thereof in order to divert or, better, regulate the direction of the electrons beam 3. In fact, in order to obtain the desired geometries of the products, the electrons beam 3 must be suitably moved and modulated by using the electromagnetic coils 4 which deflect it to the point of impact.

The apparatus 1 comprises a processing chamber 5 within which the free end of gun 2 ends, above the working plane 6.

As a whole, since the electrons beam 3 must be generated in a high vacuum to avoid phenomena of interaction of the electrons with the molecules in the atmosphere, the EBM apparatus 1 further comprises vacuum control means 8.

The chamber 5 comprises tanks 7 and 9 of the metal powders 10 which are preferably arranged on opposite sides with respect to the working plane 6. A picker/distributor device 11, i.e. a device intended to pick up and distribute the correct amount of powder 10, is slidably provided along the working plane 6 so as to obtain a uniform layer for the fusion step.

The three-dimensional objects or products sintered by fusion are manufactured on the working plane 6 starting from the metal powders 19 contained in tanks 7, 9.

Such powders 10 are picked up and distributed by device 11 in order to obtain an always uniform layer to be melted. A level shifter 13 is associated with the working plans 6 for regulating the development and manufacture of the products through the upwards or downwards movements along the vertical axis Y, considering that the working plane lies on a horizontal plane X.

The command and control unit 100 includes both hardware and software components interface intended to manage the entire EBM process, as well as the steps of the method of the present invention and the signals from the various sensors.

The interface software ensures the integration and functioning of all the component parts of apparatus 1 by means of the regulation and the initial setting of a composition of machine instructions that are also referred to as "theme" hereinafter, meaning by this term the set or packet of information containing the electrons beam 3 management parameters that regulate the generation and impact energy according to the operations to be performed.

The electronic unit 100 also manages the vacuum control means 8 that regulate the vacuum level inside chamber 5 by the controlled introduction of also small amounts of inert gas.

The method of the present invention for regulating the operation of an electromechanical apparatus, and in particular the EBM apparatus 1, in order to obtain certified processed products, will now be described in detail.

In its most general form, the subject method comprises the following steps:

1) an IQ calibration procedure: which verifies the proper operation of all the component parts of the apparatus necessary to ensure the full functionality thereof;

2) an OQ operational qualification procedure: which verifies the operational efficiency of the fusion process itself in order to define the setting limits of the apparatus itself;

3) a PQ performance qualification procedure: which verifies the stability and repeatability of the process within a predetermined process window.

Figure 2:
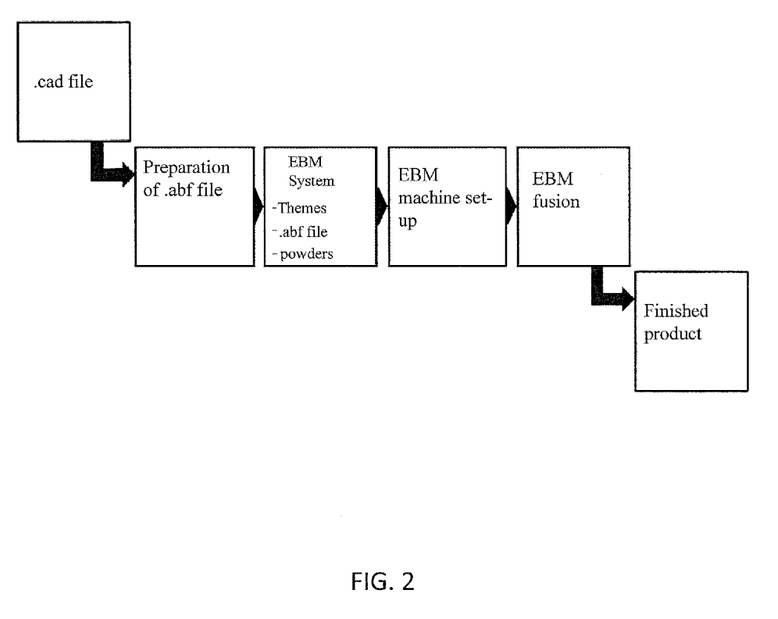
FIG. 2 shows a flowchart that schematically illustrates the different steps of a fusion process implemented by the EBM apparatus in FIG. 1.

A summary block diagram of these steps is shown in FIG. 2, which exemplifies the evolution of the EBM process steps that allows obtaining parts of any shape and geometry from a suitable preparation of a .abf file relative to the composition or theme to be developed.

Let's now see in more detail the peculiar aspects of these procedures.

Step 1) IQ Calibration Procedure

An EBM process carried out within an EBM fusion apparatus uses different files, hardware parameters and software parameters according to the type of metal powder used, for example Ti Gr.2 or Ti6Al4V. In order to realize the production programs carried out on the different types of apparatuses available, reference is made to a series of operational instructions defined together with the apparatus manufacturer.

In essence, an IQ calibration procedure is based on the verification that the hardware and software components of apparatus 1 are present and functioning, as well as that all the surrounding conditions (e.g. environmental, safety conditions, verification of any auxiliary units, calibration, etc.), if necessary, are met.

More in particular, with the initial calibration procedure, the functionality of the most important component parts of apparatus 1 is verified by means of sensors and/or measuring instruments present on the apparatus itself. Furthermore, the verification of the EBM process parameters takes place according to the worst case analysis criterion, defining and assessing the product/process characteristics in the worst operating case identified and for each apparatus supplied and for each material used by the same.

For example: in order to verify the correct functionality of the main component parts of apparatus 1 and of movable elements, the following verification must be made:
the vacuum condition of the working chamber 5 may be detected by means of pressure sensors;
the temperature of the working plane 6 and of the process environment may be detected by means of temperature sensors;
the current applied to the filament of the electronic gun 2 is easily detectable by means of a current sensor;
the movement of the movable component parts such as the distributor device 11 and shifter 13 of the working plane is detected by means of position sensors;

The calibration of vacuum sensors is checked by means of suitable certified reference instruments; while the movement of the distributor device 11 and of shifter 13 is regulated so that the distribution of the powder layers is uniform and constant for each of the manufactured layers.

In particular, the calibrations should be performed in order to verify that the HW components of the EBM process are properly calibrated, and that consequently the values read on the SW interface are true.

The verification of the calibration of the thermocouple must be done with appropriate calibration probes connected to the thermocouple cable placed in contact with the start plate. The verification of the calibration of the vacuum sensors must be done by connecting a calibration probe, by means of suitable fittings, along the main line of the turbopumps connected to the gun and to the EBM chamber and of the backing pump connected to the EBM chamber.

The verification of the HV calibration must be done using a calibrated voltmeter and by suitably connecting an adaptor to the terminals of the appropriate contacts. The mode of executing the test and the readings made must be according to what set forth in the reference specification. The calibration of the start plate movement must be verified by lowering the plate using the software interface and checking that the lowering level corresponds to the preset one.

In doing so, it can be shown that the actual settings of the machine correspond to the ideal operating conditions set forth by the manufacturer of apparatus 1.

Also the electrons beam 3 is suitably calibrated so as to be in focus on the working plane 6.

The ideal conditions can be identified in a number of parameters or reference values that are part of both the assets of the equipment on the basis of technical specifications provided by the manufacturer, and of information derived from historical series of processes already carried out which have allowed collecting data and statistical series on the apparatus settings and related outcomes of the processes performed.

These data and reference information are contained in the memory bank 12 associated with the command and control unit 100.

Optionally, the document review of the presence of all the components of apparatus 1 specified by the supplier as well as the documentation relating to the verification of the correct assembly of the machine is also provided, so as to ensure, at least upon the first installation, that the functionality of the machine comply with the sales specifications.

In brief, the minimum tests to be performed in the calibration step are shown in the following table:

| Ref. | Test | Requirement | Q.ty |
| --- | --- | --- | --- |
| IQ.T1 | Presence of conformity statement and IQ/OQ forms | Present and complete | NA |
| IQ.T2 | Check of the machine installations and HW/SW systems | Present and working, recording report | NA |
| IQ.T3 | Calibration of vacuum sensors, thermocouple, Z axis start plate, filament supply voltage, filament current | Calibration certificates, calibration report | NA |
| IQ.T4 | Beam calibration | Completed, presence of calibration report and file | 1 |
| IQ.T5 | EBM start up, loading of files/themes, vacuum generation, filament supply | Completed (step 1-7) | 1 |

With these tests, it is already possible to collect a set of data and values of some parameters that affect the proper performance of the subsequent fusion process. These data and values, possibly recovered in the form of range of values, are stored in the memory bank associated with the electronic command and control unit 100.

Step 2) OQ Operational Qualification Procedure

The operational qualification procedure aims to find a process window within which the EBM fusion is considered optimal. In other words, it aims at the identification of ranges of values of the process parameters within which the fusion products are considered to be of good quality.

The process parameters of the composition or theme are changed forcefully to achieve the maximum and minimum levels of energy that allow a correct fusion of the powders.

For each of these two extreme settings, or better, ends of the range of values in the process parameters, corresponding samples or specimens are realized, which are subsequently characterized and tested to ensure that in extreme conditions of use of the system, the products made will comply with the established minimum requirements. Hereinafter, example A and example B refer to the relevant outcomes of the fusion process in extreme conditions of minimum level (A=Low Energy) and maximum level (B=High Energy) of the fusion energy.

The process of example A is used to check the parameters that have the greatest impact on the quality of the products made, while the process of example B verifies the parameters that have less importance, such as those that regulate the electrons beam passage in limited areas or that correct the inaccuracies thereof.

The acceptability requirements of each test are set according to international regulations, if any, or on the basis of a historical list of data and experience of previous activities carried out by the Applicant, if the regulations are deficient.

Still by way of example, the encoded tests are performed at first by identifying the parameters with the greatest impact, and identifying their contribution in the energy balance.

The two configurations of these parameters that identify the minimum and maximum energy released during the fusion process are tested in a sequence. In addition, the aspects related to the operations of apparatus 1, such as for example the quality of the powders, the performance of the high-voltage unit, the correct calibration of the electrons beam, the movement of the shifter device and of the working plane, are covered by specific and individual tests.

In order to apply the OQ operational qualification procedure according to the method of the present invention, it was necessary to identify the critical parameters and distinguish them from those not critical, according to some principles described hereinafter.

First, it must be considered that the method of the present invention assumes that the electromechanical apparatus 1 under consideration in this case is an EBM apparatus, which carries out a fusion process based on a heat balance law.

In fact, the vacuum and powder heating conditions require the observance of an equivalence principle between heat released by the electrons beam and heat dissipated through the material.

This normally results in setting an average power of the electrons beam such as to ensure a correct balance of these amounts, expressed in terms of current required to generate the electrons beam and used for the various fusion operations, which can be distinguished in: heating; fusion of solid parts, fusion of contours and porous structures, or also any intermediate heating steps, always to ensure the correct heat balance.

Figure 3:
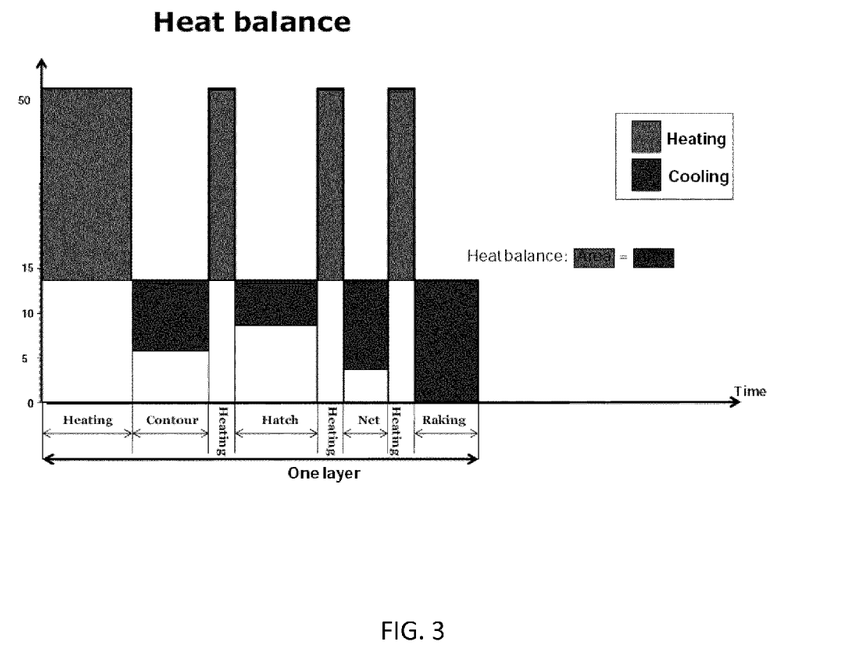
FIG. 3 shows a schematic diagram that illustrates an energy balance of an operational step of the EBM process to which the method of the present invention is applied.
Figure 4:
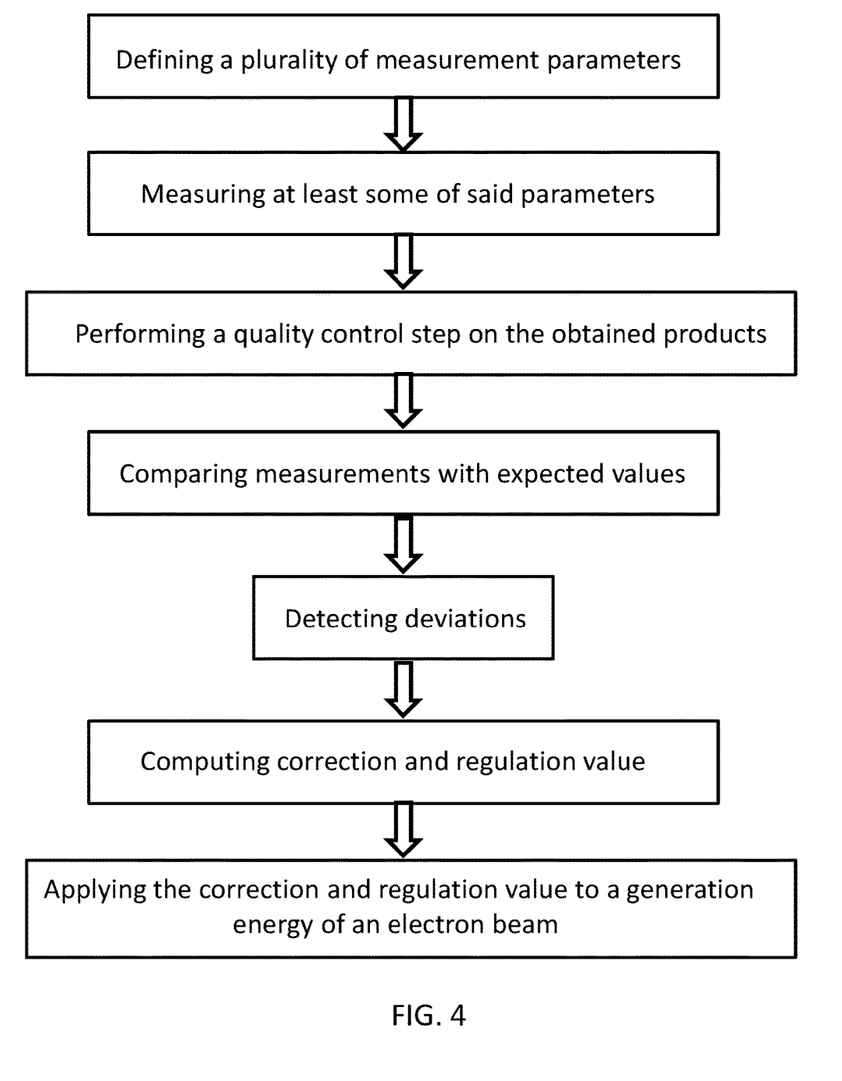
FIG. 4 is a flow diagram showing steps of a method according to the present disclosure.

FIG. 3 schematically shows a diagram of the compensated thermal balance operating principle being discussed.

More particularly, this principle must ensure the thermal balance for a total volume of solid made of any shape and size. Furthermore, in order to identify the critical parameters, each parameter of the group of calibration parameters has been evaluated for the impact it has on the process and on the final features of the products obtained by fusion.

As is clear in the above FIG. 3, the process proceeds with an alternation of heating and cooling steps affecting predetermined portions of the products that are to be made. The overall balance is in any case almost perfectly equivalent.

As already well explained above, the EBM process bases its operation on the creation of an electrons beam 3 to fuse the metal powders. The electrons are focused and moved through the use of magnetic coils 4 located at the sides of gun 2 which conveys the electrons beam in the fusion or EBM processing chamber 5.

In order to achieve the desired geometry of the products, beam 3 must be suitably moved and its energy modulated to allow proper transfer of energy to the powder, so as to fuse it and keep the temperature of the molten layer constant, so as to make uniform components from the structural point of view (density) and of physical-chemical-mechanical properties.

This process is achieved through the use of SW application and HW components, specifically:
  movement of device 11 responsible for the pick-up and distribution of the correct amount of powder, so as to obtain a uniform layer to be fused. The measurement of the amount of powder distributed is controlled by reading two sensors placed at the sides of the working plane 6.
  current of the filament of gun 2, which is linked to the energy of the electrons and which is regulated according to the operations performed by beam 3 (consisting, for each fusion process of the powder layers, of: heating of powder (a), and fusion of contours (b), solid parts (c) and net structures (d), in this order).
  management parameters of the electrons beam, contained in the information packet called "Theme" within the EBM control software application. The theme is divided by process steps (preheating, contour+melt and net) and controls the energy that the electrons beam must have in order to optimize the fusion process of the manufactured components, in terms of beam 3 and current passage speed.

Therefore, the parameters that can strongly influence the process will relate to these aspects of the electrons beam 3.

In order to further optimize the fusion process to allow maximum flexibility to the system in terms of achievable geometries, sets of parameters have been provided which improve the electrons beam behaviour at a local level, improving and refining the speed of passage in certain areas and for making particular geometries.

These parameters affect the process to a lesser extent, in terms of the final features of the product made.

It is therefore decided to divide the theme parameters in critical and non-critical, and to provide the identification of the usage intervals and tests for the first ones to check the process quality in the whole range thus identified, and a verification test of the optimization made to the process for the latter.

The ranges of critical parameters were experimentally determined by experience and know-how acquired over the years by the Applicant, in particular in the manufacture of prosthetic components with EBM technology.

Advantageously, according to the invention, it was possible to determine that each of the parameters identified as key to the process affects the amount of energy delivered by the electrons beam 3 and this has a direct impact on the characteristics of the products obtained by sintering and on their uniformity. In fact, detailed studies undertaken during the development of the apparatus and method according to the invention enabled to ascertain that the energy of beam 3, in equal environmental conditions (vacuum and other initial conditions), is responsible of the temperature level of the molten layer.

For each EBM composition or fusion theme, some equations were developed which quantify the energy of the electrons beam used, based on the following principles:

$$T \propto \frac{E}{A}$$
$$E \propto t \cdot I \cdot V$$

where:

T is the temperature of the molten layer;
E is the energy applied to the electrons beam;
A is the fusion area;
t is the time of the fusion;
I is the current of the correlation filament of the electron beam; and
V the potential across the filament.

For example, depending on the type of theme to be made, that is to say, depending on the type of products that need to be made, the control unit 100 of apparatus 1 is susceptible to compute, by means of an automated procedure, the type of energy to impart to the electrons beam for a correct and effective production of certified processed products. In doing so, the control unit uses correlation formulas between the voltage applied to the terminals of the electron gun 2, the current of the filament, the duration of exposure to the beam and the temperature of the molten layer.

Still by way of example only, the following correlation formula is used for the pre-heating step.

| Theme | Equation |
|---|---|
| Pre-heat-ing | $E = V \cdot \frac{current}{speed} \cdot (\text{line offset} \cdot (\text{number of repetitions} + \text{line order}))$ |

Other correlation formulas are used for the other actual fusion steps of the body of the products or fusion of the contours or curing of the lattice.

It should be noted that if a parameter of the correlation formula is modified, it is appropriate to also modify others for compensation. In this way, however, it is also possible to define the extreme limits to the variation of the parameters with the identification of a range of multiple values within which most of the processes to be performed find application.

For example, by varying the above parameters between the maximum and minimum values of a predetermined range, it is possible to obtain a minimum fusion energy level (example A) and a maximum fusion energy level (example B) applied by the electrons beam on the powder layer. The usage ranges of the critical parameters are given in the table below:

| EBM theme | Critical parameter |
|---|---|
| Preheating (I and II) | Av current |
| | Speed |
| | Line offset |
| | Line order |
| | N of repetitions |
| Melt/hatch | Speed function |
| | Speed |
| | Current |
| | Line offset |
| | Offset to contours |
| Melt/contours (Outer and Inner) | Speed function |
| | Offset |
| | Current |
| | Speed |
| | N of spots |
| | Spot time |
| | Overlap |
| Net | Current |
| | Speed |
| | Min overlap |
| | Min contour length |

In practice, the procedure consists in preparing the EBM apparatus according to the specifications and to the IQ calibration procedure. The parameters of the theme to be made are set with the values shown in the "example A" configuration. In a second and subsequent processing step, the parameters are set to the values indicated in the "example B" configuration.

The products obtained as a result of these settings are subjected to a series of quality tests to verify that the production step results are consistent with values indicated by reference standards and registered in the dedicated locations of the memory bank associated with the control unit 100 of the apparatus. This final control step will be described more in detail with reference to the third performance qualification step.

Again by way of non-limiting example, these quality tests may be:

Test about the dimensional correspondence L;

Tensile tests in the z direction;

Tensile tests in the directions x and y;

Complete chemical analysis;

Porosity, discontinuities or micrograph evaluation;

Visual, adhesive and compression analysis of the structural network.

The quality tests are carried out according to predetermined specifications which also include the cutting methods and schemes of the resulting samples, the heights of the cuts made and all the sizes of blocks subjected to traction or compression.

The specimens and samples are distributed in such a way as to provide an indication for all possible production volume in the EBM apparatus under examination. The validity of the intervals in the parameter values is verified by performing a specific test.

To summarize what is stated herein, a table is provided below which lists the critical parameters by type of theme used (for the heating and fusion operations of solid parts, contours and porous structures, respectively). The table also shows the effects which result from an incorrect setting of these parameters. As a result of the tests carried out, it is possible to define the validity intervals for all the parameters.

| EBM theme | Critical parameter | Influence |
|---|---|---|
| Preheating (I and II) | Av current | Balancing of process temperatures upward/downward |
| | Speed | Adjusts the beam speed |
| | Line offset | Adjusts the distance between the beam passage lines |
| | Line order | Adjusts the latency time between the beam passage between two adjacent lines |
| | N of repetitions | Number of heating steps, increases/decreases the preheating time |
| Melt/hatch | Speed function | Adjusts the correction factor of the beam speed as a function of the beam current during the fusion (and the melt pool size) |
| | Speed | Adjusts the beam speed (and the melt pool size) |
| | Current | Adjusts the beam current (and the melt pool size) |
| | Line offset | Adjusts the distance between the beam passage lines |
| | Offset to contours | Compensates for the melt pool size by setting an offset relative to the theoretical trajectory of the beam passage |
| Melt/contours (Outer and Inner) | Speed function | Adjusts the correction factor of the beam speed as a function of the beam current during the fusion (and the melt pool size) |
| | Offset | Compensates for the melt pool size by setting an offset relative to the theoretical trajectory of the beam passage |
| | Current | Adjusts the beam current (and the melt pool size) |
| | Speed | Adjusts the beam speed (and the melt pool size) |
| | N of spots | Adjusts the beam power (and the melt pool size) |
| | Spot time | Adjusts the beam stay time in a spot (and the melt pool size) |
| | Overlap | Adjusts the beam overlap between two contiguous lines |
| Net | Current | Adjusts the beam current (and the melt pool size) |
| | Speed | Adjusts the beam speed (and the melt pool size) |
| | Min overlap | Adjusts the beam overlap between two contiguous lines |
| | Min contour length | Adjusts the beam stay time in a spot (and the melt pool size) |

Step 3) PQ Performance Qualification Procedure

The final PQ procedure is based on the verification of the configuration of process parameters and on the confirmation of the capacity of the same, based on pre-established acceptability criteria.

This PQ procedure should therefore verify that the EBM process has been able to produce fused components having features complying with the provisions of the acceptability criteria in a stable and repeatable manner.

To do so, quality checks are carried out on samples of the products obtained.

Such controls may be by sampling or on the first production batches, for example the first three batches, or even on all the batches in case of limited series and high quality productions. Of course, the choice of the type of sampling depends on various factors which do not fall within the principles of the present invention and therefore the description thereof will be omitted to avoid encumbering the following.

Since the EBM process bases its operation mainly on the creation of an electrons beam to fuse the metal powders, it is established to evaluate the final characteristics of the fused powders in order to verify the production stability of the process for a number of processes equal to at least three, which represents a minimum of guarantee of repeatability of the fusion operations.

The critical parameters regulate the characteristics of the electrons beam and determine the amount of energy E released on the powder layer (and consequently the generation current and the electrons beam speed required). There are also non-critical parameters that refine the passage of the electrons beam to enable the realization of different geometries, even within a same processing step.

By acting on the functions that modulate the electrons beam according to the length of the lines to be fused, to the distance from the piece contour and to the presence or not of a fused layer in the underlying layers, all factors directly read from the .abf file loaded at the beginning of the processing step (see FIG. 2), the non-critical parameters are used to maintain the same efficiency of the electrons beam in any area of the construction volume and for any geometry realized.

Moreover, since the operation of the EBM system has been verified by means of the OQ procedure within a well determined process window, the tests provided by the PQ procedure are carried out on material produced using process parameters falling within the above usage field the apparatus and verifiable by monitoring the same.

Again by way of illustration, seven test were developed to be run for the first three consecutive production processes (irrespective of the size but belonging to the products that can be manufactured).

| | |
|---|---|
| PQ.T1 | Micrography |
| PQ.T2 | Porosity/discontinuity |
| PQ.T3 | Full traction |
| PQ.T4 | Oxygen and nitrogen analysis |
| PQ.T5 | Dimensional inspection (XY and Z) |
| PQ.T6 | Visual inspection |
| PQ.T7 | Logstudio report check |

Well, according to the method of the present invention, if the results of the tests or of the various tests are within the limits, the process is considered under control and the related products are considered complying with the specifications and thereby certified.

Otherwise, a corrective action is activated in order to bring the process back to the ideal operating conditions, compensating for all drifts.

Advantageously, the regulation intervention on the generation energy E of beam 3 of the EBM apparatus allows quickly remedying more than one drift that afflicts more than one parameter. Operatively, the regulation of said electrons beam 3 generation energy is carried out by regulating the current applied to the filament of an electronic generation gun 2 of the beam itself.

In essence, the regulation of the generation energy E of the beam is a correction applied to a single parameter against the deviation of one or more process parameters.

Any corrections or corrective compensations of process drifts are carried out by changing a single related parameter that, in this case, is represented by the application energy of the electrons beam of the EBM apparatus.

Other optional actions may be taken, such as:
new laboratory tests to confirm the actual passing of the acceptability limits;
verification of some hardware parts of the apparatus;
verification of the calibration of the critical process parameters;
verification of the correct application of process execution/control procedures/instructions (e.g.: process execution, process control and staff training);
increasing the monitoring frequency of the critical process parameters to determine the stability thereof over time.

The men skilled in the art will understand that modifications and variations may be made to the method of the present invention without departing from the underlying principles, as defined in the following claims.

The invention claimed is:

1. A method for regulating an operation of an electromechanical apparatus in order to obtain certified processed products, of the type in which it is provided an initial calibration step that is intended to check the proper functioning of all component parts of the apparatus structured to ensure the complete functionality and a subsequent quality control step carried out on obtained products by a carried out working process, the method comprising:

defining a plurality of measurement parameters relating to component parts of the apparatus,
wherein the parameters are set in a predetermined interval between a series of maximum and minimum values;
measuring at least some of said parameters by means of sensors and/or measurement indicators related to said parameters during at least one processing phase performed by said apparatus, wherein the sensors and/or measurement indicators are coupled to an apparatus control unit;
performing a quality control step on the obtained products after the working process, and obtaining data on any deviation from an expected quality;
comparing detected measurements of said parameters and data on any deviation from the expected quality with corresponding values of reference parameters available for that specific apparatus and for those products;
detecting any deviations in one or more of the measured parameters or the data with respect to the values of the reference parameters;
computing, on the basis of the detected deviations, a total correction and regulation value;
applying said total correction and regulation value to a generation energy of an electron beam of an EBM apparatus; the generation energy of the electron beam being obtained from correlation formulas between the parameters associated to the component parts of the apparatus based on the following relations:

$$T \propto \frac{E}{A}$$
$$E \propto t \cdot I \cdot V$$

wherein:
T is a temperature of the molten layer;
E is an energy applied to the electron beam;
A is a fusion area;
t is a time of the fusion;
I is a current of the correlation filament of the electron beam; and
V is a potential across the filament;
the control unit of the apparatus being able to compute on the basis of said formulas, and by means of an automated procedure, a type of energy to apply to the electron beam to realize processed products corresponding to a predetermined quality level,
wherein the maximum and minimum value for each parameter is set according to said formula, and
wherein the definition of the plurality of measurement parameters relating to component parts of the apparatus is modifiable during the useful life of the apparatus and also after an application of said total correction and regulation value.

2. The method according to claim 1, wherein the regulation of said generation energy of the electron beam is realized by means of an adjustment of an electric potential and/or current applied to a generation system of said electron beam.

3. The method according to claim 1, wherein a possible drift of just one parameter related to a mechanical structural part of the apparatus provides for a correction and adjustment of that one single structural mechanical part.

4. The method according to claim 1, wherein the step of quality control of the obtained products by means of said at least one working process provides for a predefined series of dimensional, chemical-physical and resistance controls.

5. The method according to claim 4, wherein said quality control provides at least the following tests on specimens of the obtained products from the working process:
Test about the dimensional correspondence L;
Tensile tests in the z direction;
Tensile tests in the directions x and y;
Complete chemical analysis;
Porosity, discontinuities or micrograph evaluation;
Visual, adhesive and compression analysis of the structural network.

6. The method according to claim 1, wherein a measuring phase of at least some of the parameters is performed by means of sensors and/or measurement indicators mounted on the same apparatus.

7. The method according to claim 1, wherein measurements of said parameters and the values of the reference parameters are stored in a memory portion associated to a command and control unit of the apparatus.

8. The method according to claim 4, wherein said quality controls on the obtained products can be regulated by sampling at a fixed rate or on first production lots.

9. The method according to claim 4, wherein for a pre-heating phase the following correlation formula is used:

| Theme | Equation |
|---|---|
| Pre-heating | $E = V \cdot \dfrac{\text{current}}{\text{speed}} \cdot (\text{line offset} \cdot (\text{number of repetitions} + \text{line order}))$ | while other correlation formulas are used for other actual fusion steps of a product body or fusion of contours or curing of a lattice.

10. An electromechanical apparatus structured in order to obtain certified processed products according to claim 1.

11. The electromechanical apparatus according to claim 10, incorporating a system for generating an electron beam capable of being controlled according to the method of claim 1.

12. The electromechanical apparatus according to claim 10, wherein said electromechanical apparatus is an EBM apparatus.

13. The method according to claim 1, wherein the initial calibration step allows to set operating parameters between a calibration at a minimum level of fusion energy and a calibration at a maximum level of fusion energy for the electron beam active on a powders layer.

14. The method according to claim 1, wherein said electromechanical apparatus is an EBM apparatus.

15. The method according to claim 2, wherein a possible drift of just one parameter related to a mechanical structural part of the apparatus provides for a correction and adjustment of that one single structural mechanical part.

* * * * *